(12) United States Patent
Ono (10) Patent No.: US 6,521,930 B2
(45) Date of Patent: Feb. 18, 2003

(54) SEMICONDUCTOR DEVICE HAVING $Ta_2O_5$ THIN FILM

(75) Inventor: Haruhiko Ono, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/875,340

(22) Filed: Jun. 6, 2001

(65) Prior Publication Data

US 2001/0050363 A1 Dec. 13, 2001

(30) Foreign Application Priority Data

Jun. 7, 2000 (JP) ........................................ 2000-170966

(51) Int. Cl.[7] ........................ H01L 29/76; H01L 27/108
(52) U.S. Cl. ........................... 257/295; 257/43; 257/310
(58) Field of Search ............................... 257/57, 66, 43, 257/310, 532, 295

(56) References Cited

U.S. PATENT DOCUMENTS

| | | | | |
|---|---|---|---|---|
| 6,376,299 B1 | * | 4/2002 | Joo et al. | 257/295 |
| 2002/0025626 A1 | * | 2/2002 | Hattangady et al. | 438/240 |
| 2002/0034857 A1 | * | 3/2002 | Park et al. | 438/396 |

FOREIGN PATENT DOCUMENTS

| | | | | |
|---|---|---|---|---|
| JP | 60-5531 | 1/1985 | ......... | H01L/21/316 |
| JP | 62-136035 | 6/1987 | ......... | H01L/21/316 |
| JP | 64-82557 | 3/1989 | ........... | H01L/27/04 |
| JP | 4-359557 | 12/1992 | ........... | H01L/27/04 |

* cited by examiner

*Primary Examiner*—Minh Loan Tran
(74) *Attorney, Agent, or Firm*—Hayes Soloway PC (57) ABSTRACT

In the case where a $Ta_2O_5$ thin film having double bond Ta=O is employed for a capacitative insulating film, Rapid Thermal Anneal in oxygen, and $UV/O_3$ treatment are executed at suitable temperature and in suitable time. Whether or not absorption peak which appears in 2340 $cm^{-1}$ exists and whether it is large or small are monitored by measuring a transmission infrared absorption spectrum of a $Ta_2O_5$ thin film with Fourier Transform Infrared Spectroscopy. In the case where a $Ta_2O_5$ thin film, in which an abundance ratio of oxygen in a three coordinate bonding state is large, is employed for a capacitative insulating film, an intensity ratio of each double peak which appears in 510 $cm^{-1}$ and 570 $cm^{-1}$ is measured as well, so that the film whose ratio (510/570) is larger than another one is used as Man character to improve quality of a film. Consequently, it is made possible to provide a manufacturing method of a semiconductor device in which a $Ta_2O_5$ thin film, which has high permittivity and low leak current, is employed for a capacitative insulating film.

3 Claims, 7 Drawing Sheets

SEMICONDUCTOR DEVICE HAVING $Ta_2O_5$ THIN FILM

BACKGROUND OF THE INVENTION

The present invention relates to a semiconductor device and its manufacturing method, and in particular, to a semiconductor device which has a capacitative element in which tantalum oxide ($Ta_2O_5$) is employed for a capacitative insulating film and its manufacturing method.

Description of the Related Art

In a manufacturing method of a semiconductor device of this kind, high permittivity $Ta_2O_5$ has been employed for a semiconductor device having a capacitative element (DRAM, for example) for the purpose of high integration. Just after a $Ta_2O_5$ thin film is produced, the characteristics are poor. Therefore methods for improving the characteristics such as heat treatment have been proposed. The following examples have been proposed:

- a process for producing a $Ta_2O_5$ film of high quality by thermal oxidation to a laminated film of $Ta_2N$ and Ta (Japanese Patent Application Laid-Open No.SHO62-136035);
- a process for executing heat treatment in order to densify a $Ta_2O_5$ film by ion implantation of titanium after the film is produced (Japanese Patent Application Laid-Open No.HEI 4-359557);
- a process for executing heat treatment in order to densify a $Ta_2O_5$ film by ion implantation of fluorine after the film is produced (Japanese Patent Application Laid-Open No.SHO64-82557); and
- a process for producing a $Ta_2O_5$ film by thermal oxidation after a Ta film is converted into amorphous (Japanese Patent Application Laid-Open No.SHO60-5531).

However, in any case described above, a physical property of the film in an atomic bonding level and its changes according to the post processes have not been comprehended exactly, and therefore these methods are just experiential ones. That is because the $Ta_2O_5$ in an atomic bonding state (crystal structure) is extremely complex, so that there is no means to evaluate the quality of the film easily, and that there is no character to control it.

The first problem is that although high permittivity and low leak current are required even in a thin film of under 10 nm thickness; it is impossible to control and produce a stable film having high quality. This is because a physical property which is, different from a bulk material is shown when $Ta_2O_5$ is thinned down and is used as a capacitative insulating film.

The second problem is that although some improvements in the characteristics are made by heat treatment and so forth, in order to solve the problem, these methods are just experiential ones because a physical property of the film and its changes have not been comprehended exactly. This is because $Ta_2O_5$ in an atomic bonding state (crystal structure) is extremely complex, so that there is no means to evaluate the quality of the film easily, and that there is no character to control it.

SUMMARY OF THE INVENTION

It is therefore an object of the present invention to provide a manufacturing method of a semiconductor device, in which a $Ta_2O_5$ thin film, which has high permittivity and low leak current, is employed for a capacitative insulating film.

Another object of the present invention is to provide a method for monitoring an atomic bonding state in a film, which is for the purpose of controlling quality of a $Ta_2O_5$ film.

First, for achieving the objects mentioned above, a $Ta_2O_5$ thin film that has double bond (Ta=O) of Ta and O (oxygen) is employed for a capacitative insulating film. By measuring a transmission infrared absorption spectrum of a $Ta_2O_5$ thin film using Fourier Transform Infrared Spectroscopy (FTIR), it is monitored whether absorption peak that appears in 2340 $cm^{-1}$ exists or not and it is large or small. This technique is realized because a new fact has been brought to light that the existence of the peak described above is discovered and the peak is the absorption peak which appears by stretching vibration of Ta=O. As a concrete process, there are Rapid Thermal Anneal (RTA) in oxygen and $UV/O_3$ (Ultra Violet-Ozone) treatment at a suitable temperature and in suitable time, for example.

Second, a $Ta_2O_5$ thin film, wherein an abundance ratio of oxygen in a three coordinate bonding (triple bonding) state is large, is employed for a capacitative insulating film. By using FTIR, an intensity ratio of each double peak which appears around 510 $cm^{-1}$ and 570 $cm^{-1}$ is measured, so that the $Ta_2O_5$ film whose ratio (510/570) is larger than another one is used as a character in order to improve the quality of a film. This technique is realized because a new fact has been brought to light that all of the peak appears by an asymmetric stretching vibration mode of three coordinate oxygen (O≡3Ta).

By using a $Ta_2O_5$ film which has Ta=O bond or that of which an abundance ratio of oxygen in a three coordinate bonding state is large as a capacitative insulating film, the capacitance characteristics of leak electric current and reduced coating thickness etc. are improved. First, this is because Ta=O double bond whose bonding strength is very strong is produced by dissociation of organic impurities in CVD raw gas over 500° C. and atomic oxygen bonding to the vacant site. Second, this is because the quality of the film becomes strong by producing more stable three coordinate bond than unstable two coordinate bond (Ta—O—Ta) in the complex crystalline structure of $Ta_2O_5$.

After measuring Ta=O peak or an intensity ratio of the 510/570 peak in a $Ta_2O_5$ thin film which has been processed by a variety of heat treatment, in comparison with these capacitance characteristics, there is an evident relevance. Therefore, the present invention is as follows:

(1) a semiconductor device wherein an Amorphous $Ta_2O_5$ thin film having double bond (Ta=O) of Ta with O (oxygen) which is formed on a semiconductor substrate is a capacitative insulating film;

(2) a semiconductor device wherein a polycrystal or single crystal $Ta_2O_5$ thin film having double bond (Ta=O) of Ta with O (oxygen) which is formed on a semiconductor substrate is a capacitative insulating film;

(3) a semiconductor device wherein a $Ta_2O_5$ thin film in which an abundance ratio of oxygen in a three coordinate bonding state is large, which is formed on a semiconductor substrate, is a capacitative insulating film;

(4) a manufacturing method of a semiconductor device comprising steps of:
  adhering a $Ta_2O_5$ thin film on an N-type silicon substrate by chemical vapor deposition; and
  forming an amorphous $Ta_2O_5$ thin film having double bond (Ta=O) of Ta with O (oxygen) by executing Rapid Thermal Anneal at 300–600° C. to the $Ta_2O_5$ thin film under an oxidized atmosphere;
(5) the manufacturing method of a semiconductor device as described in (4), wherein the Rapid Thermal anneal is executed while infrared absorption peak of 2340 $cm^{-1}$ in the $Ta_2O_5$ thin film is measured;
(6) the manufacturing method of a semiconductor device as described in (5), wherein a state of distribution of Ta=O bond in the $Ta_2O_5$ thin film is monitored by the measurement;
(7) the manufacturing method of a semiconductor device as described in (4), wherein the Rapid Thermal Anneal is executed within 1 second–4 hours;
(8) a manufacturing method of a semiconductor device comprising steps of:
   adhering a $Ta_2O_5$ thin film on an N-type silicon substrate by chemical vapor deposition; and
   forming a polycrystal or single crystal $Ta_2O_5$ thin film having double bond (Ta=O) of Ta with O (oxygen) by executing Rapid Thermal Anneal at 700–1000° C. to the $Ta_2O_5$ thin film under an oxidized atmosphere;
(9) the manufacturing method of a semiconductor device as described in (8), wherein the Rapid Thermal Anneal is executed while infrared absorption peak of 2340 $cm^{-1}$ in the $Ta_2O_5$ thin film is measured;
(10) the manufacturing method of a semiconductor device as described in (9), wherein a state of distribution of Ta=O bond in the $Ta_2O_5$ thin film is monitored by the measurement;
(11) the manufacturing method of a semiconductor device as described in (8), wherein the Rapid Thermal Anneal is executed within 1 second–4 hours;
(12) a manufacturing method of a semiconductor device comprising steps of:
   adhering a $Ta_2O_5$ thin film on an N-type silicon substrate by chemical vapor deposition; and
   forming a $Ta_2O_5$ thin film in which an abundance ratio of oxygen in a three coordinate bonding state is large by executing Rapid Thermal Anneal at 700–1000° C. to the $Ta_2O_5$ thin membrane under an oxidized atmosphere;
(13) the manufacturing method of a semiconductor device as described in (12), wherein the Rapid Thermal Anneal is executed while an intensity ratio of infrared absorption peak of 510 $cm^{-1}$ and 570 $cm^{-1}$ in the $Ta_2O_5$ thin film is measured;
(14) the manufacturing method of a semiconductor device as described in (13), wherein a state of distribution of Ta=O bond in the $Ta_2O_5$ thin film is monitored by the measurement;
(15) the manufacturing method of a semiconductor device as described in (12), wherein the Rapid Thermal Anneal is executed within 1 second–4 hours; and
(16) a manufacturing method of a semiconductor device comprising steps of:
   forming a barrier film on an N-type silicon substrate by rapid nitriding and adhering the first $Ta_2O_5$ thin film on the barrier film by chemical vapor deposition;
   executing $UV/O_3$ treatment to the first $Ta_2O_5$ thin film at 300–550° C. and furnace heat treatment to it at 700–1000° C. under an oxidized atmosphere;
   adhering the second $Ta_2O_5$ thin film on the first $Ta_2O_5$ thin film by chemical vapor deposition; and
   executing $UV/O_3$ treatment to the second $Ta_2O_5$ thin film at 300–550° C. and furnace heat treatment to it at 700–1000° C. under an oxidized atmosphere.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now to the drawings, embodiments of the present invention will be explained in detail.

Figure 1:
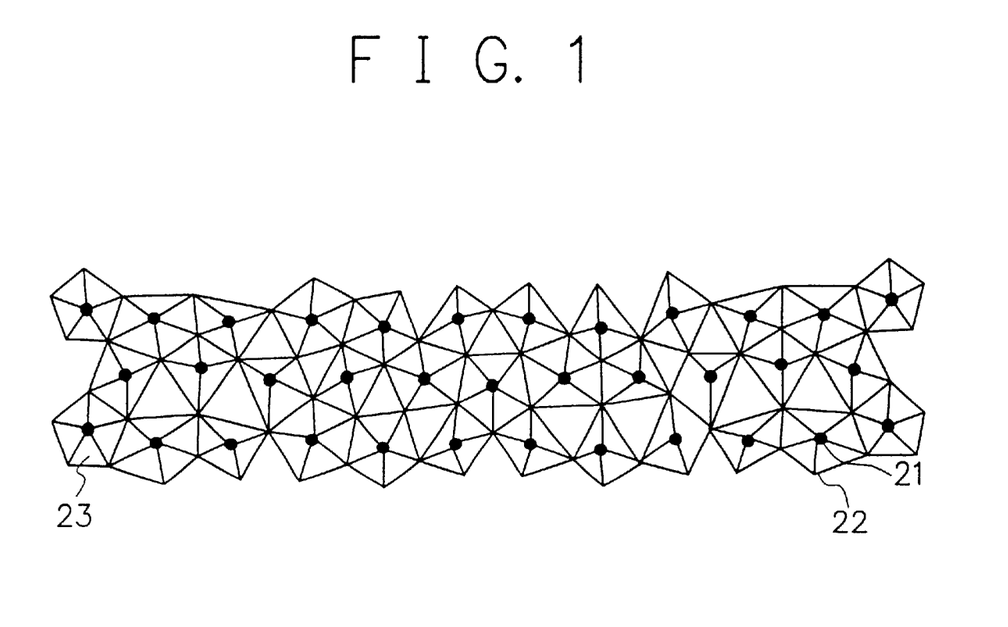
FIG. 1 is a subsidiary view explaining the embodiment of FIG. 2.

FIG. 1 shows atomic arrangement of Ta and O in x-y plane of an unit cell in $\beta$-$Ta_2O_5$, which is stable at a normal temperature under 1340° C. It is known that the atomic arrangement has a large specific structure in which the unit cell comprises twenty-two Ta atoms and fifty-five O atoms, and that a lot of bond of Ta—O—Ta is repeated in a z-axis direction. In $Ta_2O_5$, Ta is six or seven coordinations (ligands), which includes O≡3Ta by oxygen of three coordinations and O—Ta bond in a c-axis direction. However, an unit cell of $Ta_2O_5$ is extremely complex, in which almost all O≡3Ta dose not have three times symmetry axis because of a strong distortion, and also Ta—O—Ta bond easily appears in the x-y plane. Especially in a thin film, it is not an ideal unit cell of bulk such as shown in FIG. 1.

FIG. 2 is a schematic view showing classification of a bonding state of oxygen in $Ta_2O_5$. Respective FIGS. 2A to 2E show: double bond of oxygen in a z-axis direction, double bond in x-y plane, three coordinate bond (O≡3Ta) of oxygen in x-y plane, two coordinate bond (Ta—O—Ta) of oxygen in x-y plane, and two coordinate bond (Ta—O–Ta) of oxygen in a z-axis direction, respectively. Referring to FIGS. 2A to 2E, according to an embodiment of the present invention, a $Ta_2O_5$ thin film having double bond of oxygen in x-y plane and a z-axis direction is formed, which is employed for a capacitative insulating film. According to another embodiment of the present invention, a $Ta_2O_5$ thin film having more three coordinate bond of oxygen in the x-y plane is formed, which is employed for a capacitative insulating film.

According to an example 1 of the present invention, $Ta_2O_5$ (100 nm coating thickness), which is directly produced on an 8 inch n—Si substrate by means of chemical vapor deposition (referred to as CVD hereinafter) at 450° C., is used as a sample. Rapid Thermal Process (referred to as RTP hereinafter) in dry oxygen or nitrogen at 300–1000° C. in 1 second–4 hours is executed on the sample cut into 1 cm square. A programming rate (a rate of increasing temperature) is set as 100° C./min and self-cooling is employed for decreasing temperature. In the case of heat treatment in nitrogen, increasing temperature is started after 1 hour nitrogen-purging after the cut sample is set.

Figure 3A:
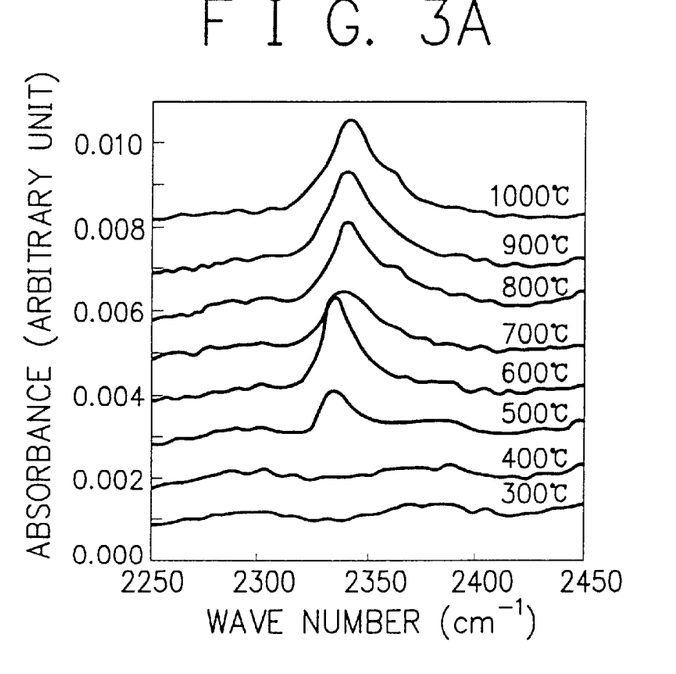
FIG. 3A is a graph explaining an example 1 of the present invention.
Figure 3B:
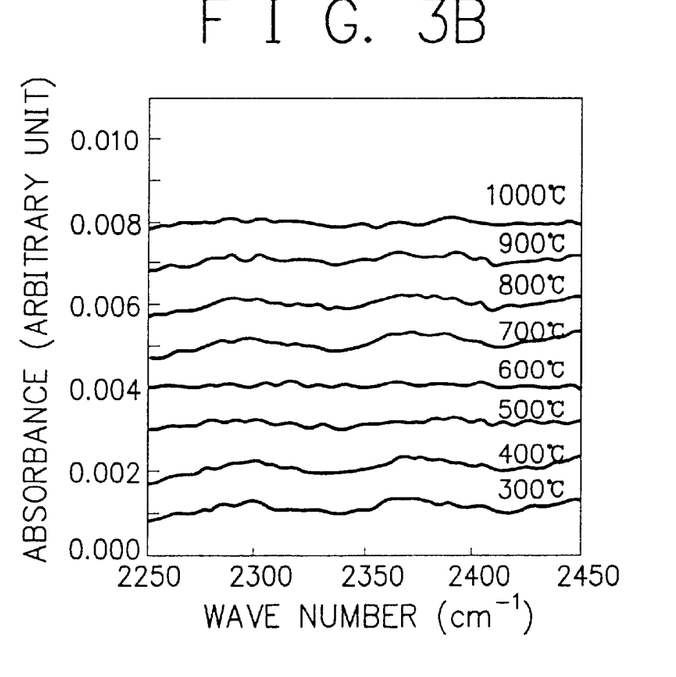
FIG. 3B is a graph explaining an example 1 of the present invention.

FIG. 3A shows an infrared absorption spectrum of each $Ta_2O5$ thin film which is processed by RTP heat treatment (300° C.–1000° C., min) in oxygen. Evident absorption peak appears nearby 2350 $cm^{-1}$ the heat treatment over 500° C. $Ta_2O_5$ is amorphous under 600° C. and is crystallized over 700° C. The peak point of $Ta_2O_5$ is 2335 $cm^{-1}$ in amorphous, but it shifts to 2340 $cm^{-1}$ when $Ta_2O_5$ is crystallized and its peak Intensity changes discontinuously between 600° C.–700° C. Thereby it turns out that the peak results from atomic bond in the $Ta_2O_5$ film. On the other hand, FIG. 3B shows an infrared absorption spectrum of each $Ta_2O_5$ thin film which is processed by RTP heat treatment (300° C. –1000° C., 10 min) in nitrogen. In this case, the peak, which appears by the heat treatment in oxygen, does not appear by the heat treatment in nitrogen. Thereby it is clear that the peak results from bond of oxygen.

Just after a $Ta_2O_5$ film is produced, a large amount of water and organic impurities are contained in it. However, the elements are dissociated over 500° C. according to results of experiments such as TDS and XPS. Therefore, in a process of as-deposition (referred to as as-depo hereinafter), the large amount of water and organic impurities are removed and Ta=O bond is formed by oxygen bonding to the vacant site, so that the vibration in 2340 $cm^{-1}$ occurs.

In the case where the heat treatment like above is executed on a $Ta_2O_5$ film which is produced by a method of CVD, the more Ta=O bond exists in a film (that is, in oxygen compared with in nitrogen), the better electric characteristics such as permittivity and leak current are evidently shown.

Figure 4:
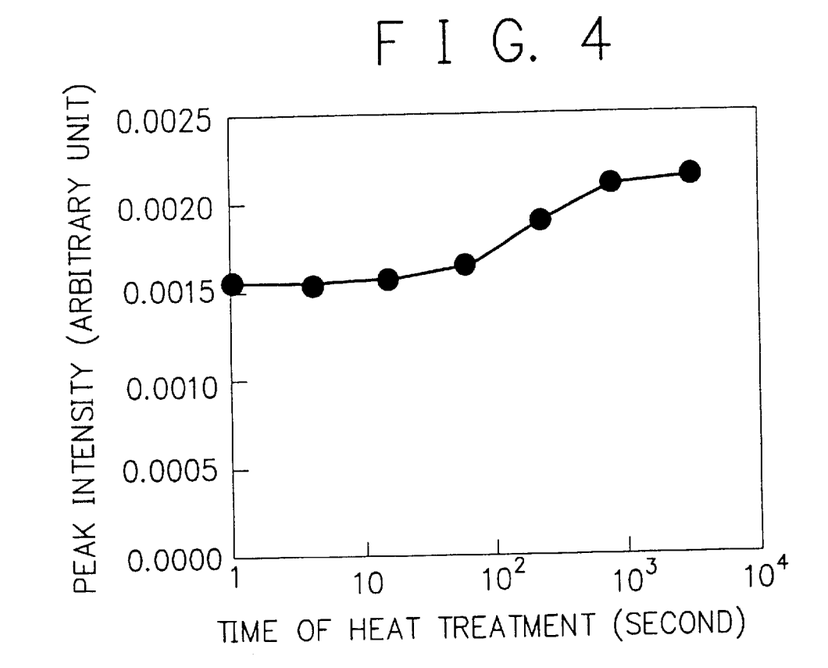
FIG. 4 is a graph explaining an example 2 of the present invention.

According to an example 2 of the present invention, here is a description of a process in the case where the time of heat treatment is changed. FIG. 4 is a graph in which intensity of 2340 $cm^{-1}$ infrared absorption peak of a $Ta_2O_5$ thin film to which RTP heat treatment is executed in oxygen at 800° C. is plotted against the time of heat treatment. There is little time dependency, so that it is possible to let the peak appear by heat treatment in one second. Therefore, the 2340 $cm^{-1}$ peak appears if oxygen is contaminated in entering into a furnace even when an operation of heat treatment in nitrogen is executed. The results of this experiment means that the diffusion of oxygen in the $Ta_2O_5$ film is extremely fast. That is, heat treatment at a high temperature in a short time is effective to form Ta=O bond.

Figure 5:
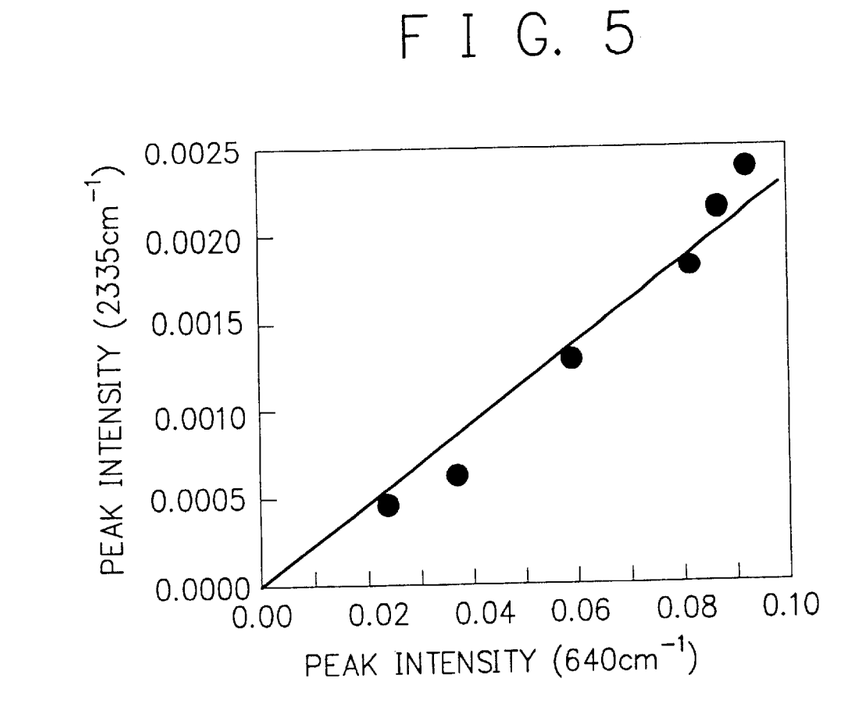
FIG. 5 is a graph explaining an example 3 of the present invention.

According to an example 3 of the present invention, here is a description about distribution of Ta=O bond in a film. In order to examine a state of distribution in 2340 $cm^{-1}$ peak in a $Ta_2O_5$ film, an operation to make the film thin step by step by HF etching. A sample of amorphous is examined, to which heat treatment is executed on the condition of 600° C.×10 min. This is because peeling occurs by HF treatment in the case of using a sample of crystallized $Ta_2O_5$. FIG. 5 shows a relationship of Ta=O peak intensity in each of 2335 $cm^{-1}$ and 640 $cm^{-1}$. The value of the peak intensity is in proportion to thickness of a $Ta_2O_5$ film because the 640 $cm^{-1}$ peak results from the Ta=O bond in the $Ta_2O_5$. Therefore, the linear relationship shown in FIG. 5 means that some bond in 2335 $cm^{-1}$ peak is equally distributed in the $Ta_2O_5$ film. That is, it is possible to distribute Ta=O bond over the inside of $Ta_2O_5$ film equally by suitable heat treatment.

Figure 6:
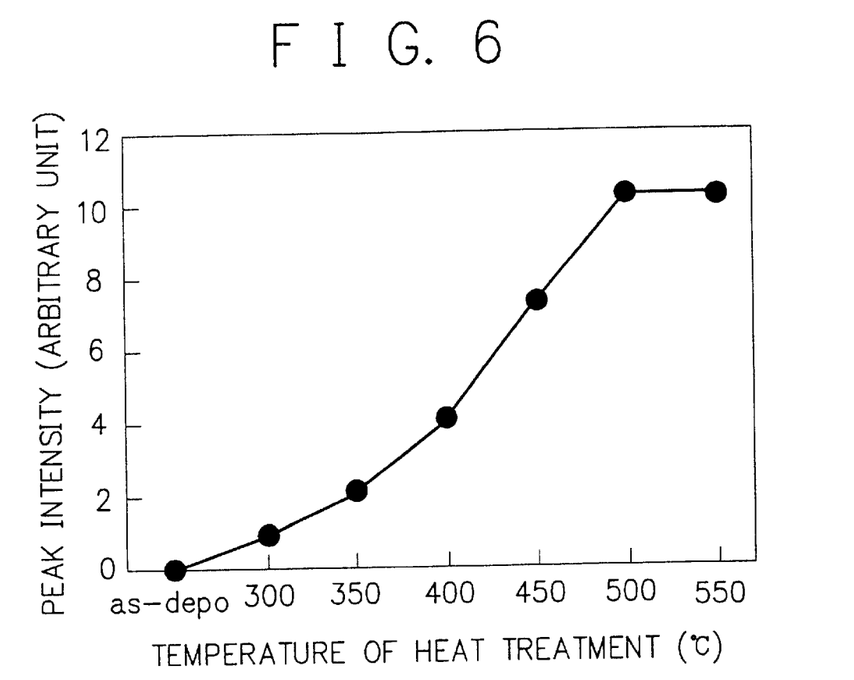
FIG. 6 is a graph explaining an example 4 of the present invention.
Figure 7:
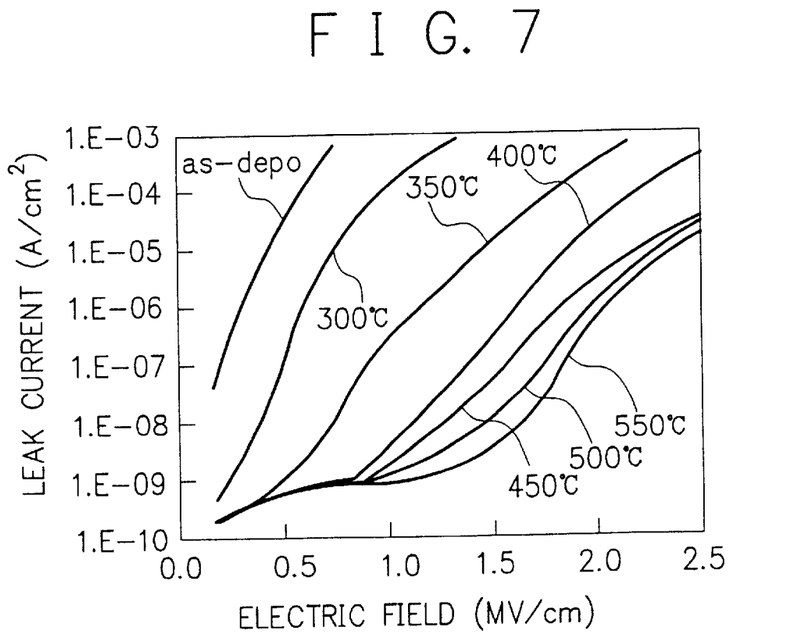
FIG. 7 is a graph explaining an example 4 of the present invention.

The explanation described above is an example in the case of RTP heat treatment. But also in the case where operations such as $UV/O_3$ annealing and furnace annealing are executed, it is possible to form Ta=O bond which does not appear in as-depo. According to an example 4 of the present invention, FIG. 6 is a graph in which each Ta=O peak intensity against each $UV/O_3$ treatment at 300° C.–550° C. is plotted. This graph proves that the higher the temperature of treatment is, the stronger the intensity becomes and the more Ta=O bond is formed. FIG. 7 is a graph, in which electric field dependency of leak current is measured, as an example showing device electric characteristics in these $Ta_2O_5$ films. The leak is reduced as the temperature of heat treatment rises, while the leak is very large in as-depo. Thus, it is possible to improve electric characteristics if a film in which more Ta=O bond is contained is formed.

It has been already known that permittivity and leak characteristics of $Ta_2O_5$ capacitor vary according to heat treatment process. And also there is a finding of measurement that coordination number of oxygen around Ta becomes large in the case of heat treatment in oxygen compared with that in nitrogen. In the case of phonon spectrum in a fundamental structure of $Ta_2O_5$, there is little difference between the case in nitrogen and that in oxygen. The only difference between the above cases is whether Ta=O bond in 2340 $cm^{-1}$ exists or not. Therefore, as a result of the introduction of oxygen by post-heat treatment such as $UV/O_3$ treatment and furnace annealing, Ta=O bond is formed, so that it is possible to improve the quality of the film.

Further, compared at the same temperature, Ta=O peak intensity is much stronger in the case of 10 minutes heat treatment by $UV/O_3$ than that of 60 minutes heat treatment by furnace. And also in the case where suitable operations of heat treatment in oxidized atmosphere such as in oxygen radical and plasma excitation are executed, the same effect is obtained.

According to an example 5 of the present invention, here is a description of a method to monitor whether or not Ta=O bond exists and its amount.

In order to measure infrared absorption peak of atomic vibration of Ta=O bond, transmission FTIR measurement of vertical incidence is executed in a room temperature. Each measurement is executed after evacuation of the room in one hour by a rotary pump in order to exclude the influence of $CO_2$ in the atmosphere. Instead of the evacuation, enough purging by nitrogen has the same effect. This is because absorption peak of $CO_2$ gas which is in the atmosphere precisely overlaps with that of Ta=O. Each spectrum in 400–4000 $cm^{-1}$ is measured at resolving power 4 $cm^{-1}$ by using DTGS detector element having a KBr window, and Ge/KBr beam splitter. A bear Si substrate in the same lot, which is processed by dilution HF treatment, is employed as a reference sample.

Figure 2A:
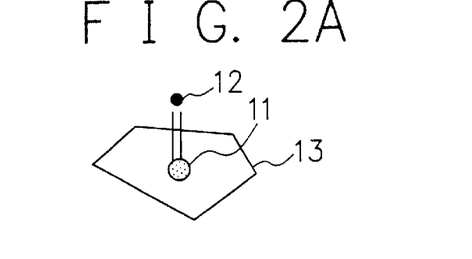
FIG. 2A is a schematic view showing double bond of oxygen in a z-axis direction.
Figure 2B:
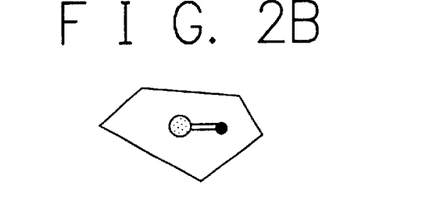
FIG. 2B is a schematic view showing double bond in x-y plane.
Figure 2C:
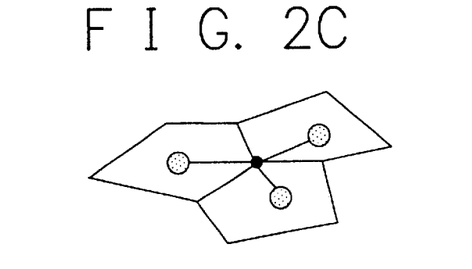
FIG. 2C is a schematic view showing three coordinate bond (O≡3Ta) of oxygen in x-y plane.
Figure 2D:
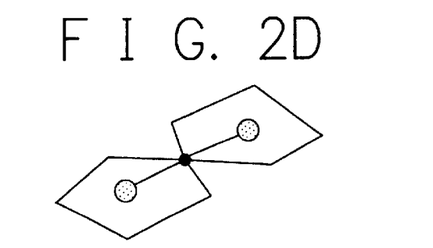
FIG. 2D is a schematic view showing two coordinate bond (Ta—O—Ta) of oxygen in x-y plane.
Figure 2E:
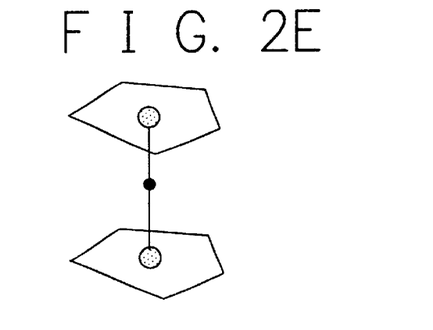
FIG. 2E is a schematic view showing two coordinate bond (Ta—O—Ta) of oxygen in a z-axis direction.

Looking to a spectrum of $Ta_2O_5$ crystal, deformation vibration modes of both O≡3Ta and Ta—O—Ta are observed in 210 $cm^{-1}$, a stretching vibration mode of O≡3Ta is observed in 510–570 $cm^{-1}$ and weak peak of a stretching vibration mode of Ta—O—Ta is observed in 810 $cm^{-1}$. That is, the 2340 $cm^{-1}$ peak is not a vibration mode by the fundamental bonding structure of $Ta_2O_5$ as shown in FIG. 1. Much stronger bonding state such as Ta=O shown in FIGS. 2A and 2B is required in order that the vibration mode of such a high wave number appears by Ta=O bond. According to the above result, the peak which is found in 2340 $cm^{-1}$ is considered as a stretching vibration mode of the Ta=O bond in the $Ta_2O_5$ film. According to the fact, it is possible to monitor whether or not Ta=O bond exists and its amount in the $Ta_2O_5$ film by detecting the absorption peak in 2340 $cm^{-1}$.

Figure 8:
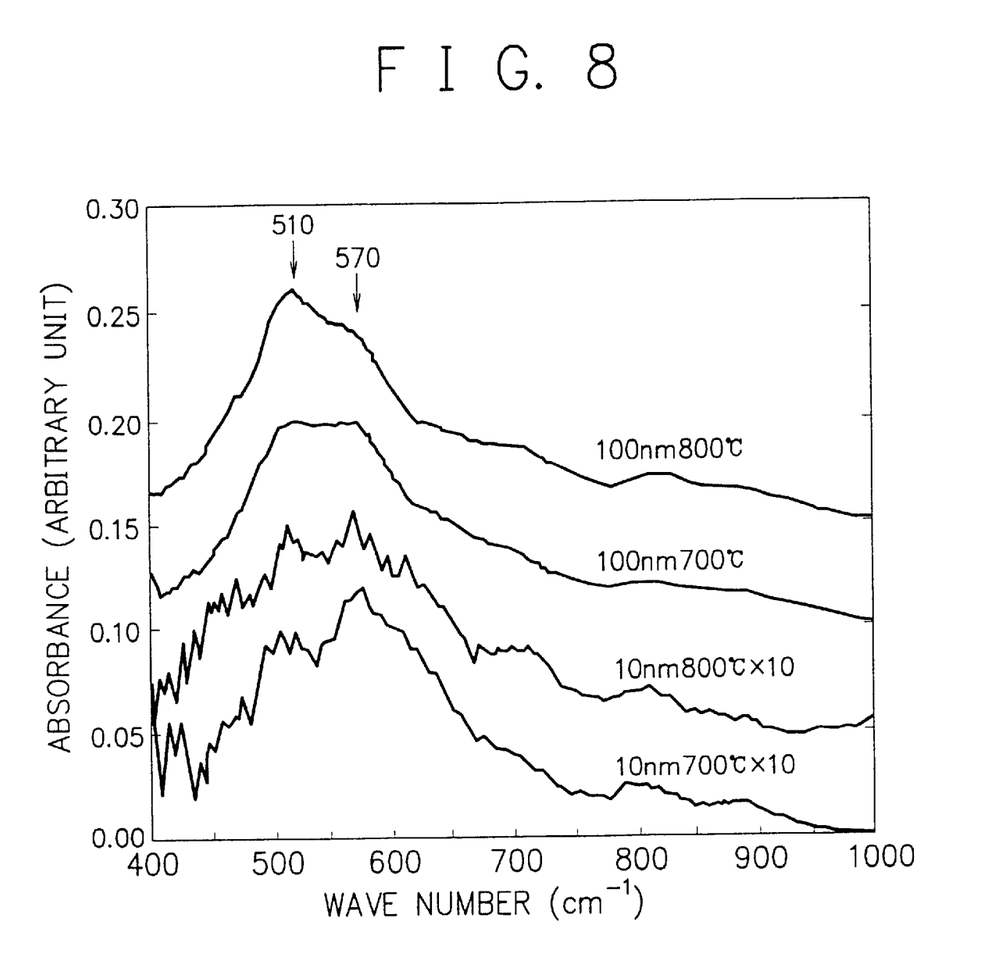
FIG. 8 is a graph explaining an example 6 of the present invention.
Figure 9A:
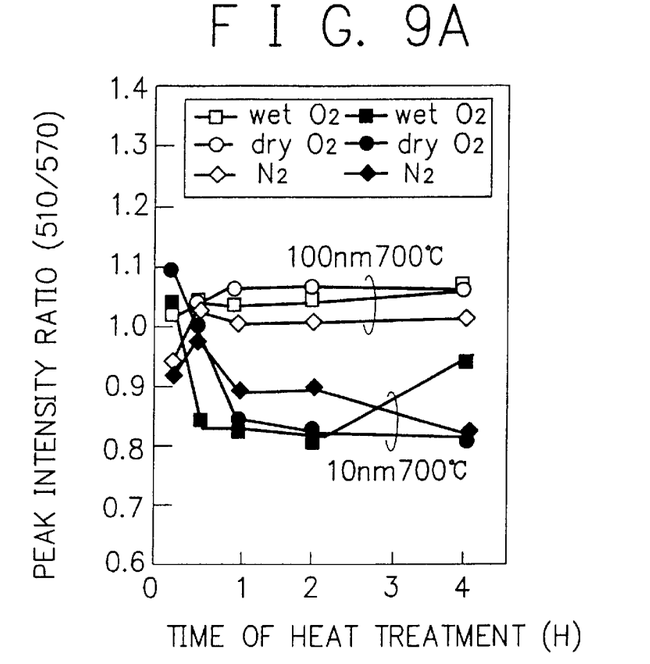
FIG. 9A is a graph explaining an example 6 of the present invention.
Figure 9B:
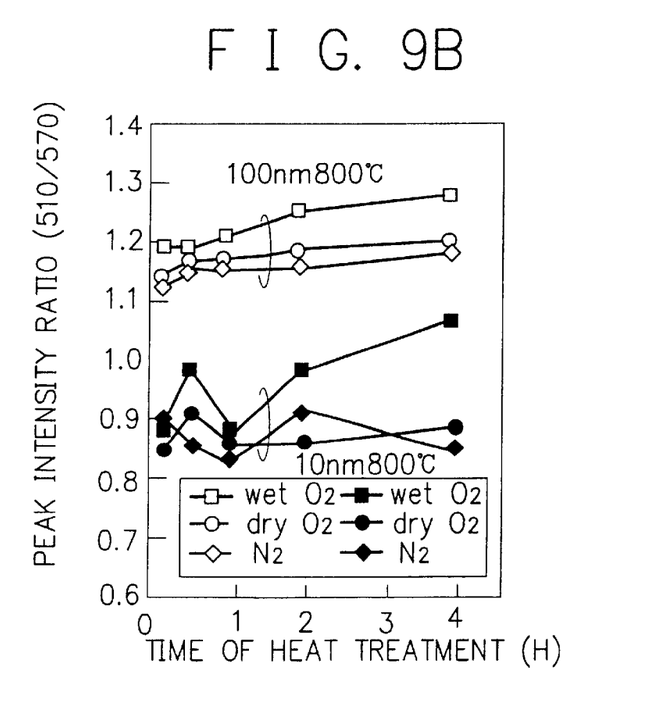
FIG. 9B is a graph explaining an example 6 of the present invention.

According to an example 6 of the present invention, here is a description about a method to monitor and control three coordinate bond of oxygen. FIG. 8 is an example of each Ta=O phonon spectrum of two kinds of a $Ta_2O_5$ thin film of coating thickness 10 nm and 100 nm, which are crystallized at 700° C. or 800° C. Each spectrum consists of two big parts of peak in 510 $cm^{-1}$ and 570 $cm^{-1}$, whose intensity ratio is different according to each sample. FIGS. 9A and 9B are graphs in which the intensity ratio in the 510 $cm^{-1}$ peak against the 570 $cm^{-1}$ peak is obtained and plotted against the square root of the time for heat treatment.

FIG. 9A shows a case of heat treatment at 700° C. The data does not make any sense since a film contains amorphous when the time for heat treatment is within one hour, but the film is crystallized when the treatment time is over one hour. There is evident coating thickness dependency. And also the peak intensity ratio is about 0.8 in the case of 10 nm sample, while it is around just over 1 in the case of 100 nm sample. Besides, FIG. 9B shows a case of the heat treatment at 800° C. The peak intensity ratio increases to about 0.9 in the case of 10 nm sample, and increases to about 1.2 in the case of 100 nm sample. These results reflects the quality of the $Ta_2O_5$ film that the thicker the $Ta_2O_5$ coating thickness is and the higher temperature the heat treatment is, the larger the 510/570 $cm^{-1}$ peak intensity ratio becomes. That is, in the case where the crystallization heat treatment to about a 10 nm film is executed at low temperature, the 510/570 $cm^{-1}$ peak intensity ratio is small and the crystallinity of $Ta_2O_5$ is not so good. This corresponds to realization of much stronger crystal structure according to the increase of three coordinate bonding structure of oxygen illustrated in FIG. 2C by heat treatment.

According to an example 7 of the present invention, by producing a $Ta_2O_5$ film by two steps, the 510/570 $cm^{-1}$ peak intensity ratio described in the example 6 increases and the leak current characteristics are improved. After a barrier film is formed by rapid nitriding at 890° C., a 4 nm $Ta_2O_5$ film is produced on it, and $UV/O_3$ treatment at 500° C. and furnace heat treatment at 800° C. are executed. Besides, producing another 4 nm $Ta_2O_5$ film over it, $UV/O_3$ treatment at 500° C. and furnace heat treatment at 800° C. are executed. This is used as a sample of producing a film by two steps. As against this, after a barrier film is formed by rapid nitriding at 890° C., an 8 nm $Ta_2O_5$ film is produced on it, which is treated by $TV/O_3$ treatment at 500° C. and furnace heat treatment at 800° C. This is used as a sample of producing a film by one step. Concerning these samples, each TO phonon (510 $cm^{-1}$ and 570 $cm^{-1}$) of Ta—O bond is measured by transmission FTIR measurement and they are compared. While the 570 $cm^{-1}$ peak is relatively strong in the case of the sample of producing a film by one step, 510/570 $cm^{-1}$ peak intensity ratio is large in the case of the sample of producing a film by two steps, and it becomes close to a spectrum of a coating thickness 100 nm sample although the coating thickness is 8 nm. That is, the quality of the $Ta_2O_5$ film having coating thickness about 8 nm is not so good, but the quality of the film is improved by the producing a film by two steps. When the electric characteristics of these samples are measured, the permittivity increases and leak current reduces in the case of the producing a film by two steps.

As set forth hereinabove, in the semiconductor device and its manufacturing method according to the present invention, the capacitance characteristics of such as the permittivity, leak current, and reduced coating thickness are improved by employing a $Ta_2O_5$ film, which has Ta=O bond and in which a three coordinate bonding abundance ratio of oxygen is large, for a capacitative insulating film. This is because: first, Ta=O bond whose bonding strength is very strong is produced by dissociation of organic impurities in CVD raw gas over 500° C. and atomic oxygen bonding to the vacant site; and second, the quality of a film becomes strong by forming more stable three coordinate bond than unstable double bond (Ta—O—Ta) in the complex structure of $Ta_2O_5$.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device wherein an amorphous $Ta_2O_5$ thin film having double bond (Ta=O) of Ta with O (oxygen) which is formed on a semiconductor substrate is a capacitative insulating film.

2. A semiconductor device wherein a polycrystal or single crystal $Ta_2O_5$ thin film having double bond (Ta=O) of Ta with O (oxygen) which is formed on a semiconductor substrate is a capacitative insulating film.

3. A semiconductor device wherein a $Ta_2O_5$ thin film in which an abundance ratio of oxygen in three coordinate bonding state is large, which is formed on a semiconductor substrate, is a capacitative insulating film.

* * * * *

UNITED STATES PATENT AND TRADEMARK OFFICE
CERTIFICATE OF CORRECTION

PATENT NO. : 6,521,930 B2
DATED : February 18, 2003
INVENTOR(S) : Ono

It is certified that error appears in the above-identified patent and that said Letters Patent is hereby corrected as shown below:

<u>Title page,</u>
Item [57], ABSTRACT,
Line 15, "Man" should be -- an --.

Signed and Sealed this

Twenty-fifth Day of May, 2004

JON W. DUDAS
*Acting Director of the United States Patent and Trademark Office*